United States Patent
Iwata et al.

(10) Patent No.: US 7,510,958 B2
(45) Date of Patent: *Mar. 31, 2009

(54) METHOD OF MANUFACTURING A SEMICONDUCTOR DEVICE INCLUDING A BUMP FORMING PROCESS

(75) Inventors: Tetsuya Iwata, Tokyo (JP); Namiki Moriga, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/633,591

(22) Filed: Dec. 5, 2006

(65) Prior Publication Data

US 2007/0077746 A1 Apr. 5, 2007

Related U.S. Application Data

(63) Continuation of application No. 10/954,520, filed on Oct. 1, 2004, now Pat. No. 7,153,764.

(30) Foreign Application Priority Data

Oct. 3, 2003 (JP) .............................. 2003-345470

(51) Int. Cl.
*H01L 21/44* (2006.01)

(52) U.S. Cl. ........................ 438/613; 438/615; 438/617; 29/860; 29/861

(58) Field of Classification Search ................. 438/613, 438/615, 617; 29/860, 861, 871
See application file for complete search history.

(56) References Cited

U.S. PATENT DOCUMENTS

| 5,060,843 | A | 10/1991 | Yasuzato et al. |
| 6,207,549 | B1 * | 3/2001 | Higashi et al. ............... 438/613 |
| 6,495,773 | B1 * | 12/2002 | Nomoto et al. ............. 174/260 |
| 7,153,764 | B2 * | 12/2006 | Iwata et al. ................. 438/613 |
| 7,229,906 | B2 * | 6/2007 | Babinetz et al. ............. 438/617 |

FOREIGN PATENT DOCUMENTS

| JP | 5-006893 | 1/1993 |
| JP | 5-235002 | 9/1993 |
| JP | 11-307571 | 11/1999 |
| JP | 2000-188303 | 7/2000 |
| JP | 2001-148394 | 5/2001 |
| JP | 2002-280412 | 9/2002 |

* cited by examiner

*Primary Examiner*—Phuc T Dang
(74) *Attorney, Agent, or Firm*—McDermott Will & Emery LLP

(57) ABSTRACT

A method of manufacturing a semiconductor device includes an improved bump forming process. The bump forming process includes a bump forming step for forming a bump on the pad by feeding a gold wire from a capillary while moving the capillary; a sliding step of slightly moving the capillary in an almost horizontal direction after the formation of the bump to reduce the strength of the base portion of the gold wire connected to the bump; and a wire cutting step of cutting the gold wire at the base portion after the sliding step. In the sliding step, a moving speed of the capillary is made smaller than that in the bump forming step.

6 Claims, 3 Drawing Sheets

METHOD OF MANUFACTURING A SEMICONDUCTOR DEVICE INCLUDING A BUMP FORMING PROCESS

RELATED APPLICATIONS

This application is a continuation of application Ser. No. 10/954,520, filed on Oct. 1, 2004 now U.S. Pat. No. 7,153,764, which in turn claims the benefit of Japanese Patent Application No. 2003-345470, filed on Oct. 3, 2003, the disclosures of which Applications are incorporated by reference herein.

BACKGROUND OF THE INVENTION

1. Field of the Invention

The present invention relates to a method of manufacturing a semiconductor device including a process of forming a bump on a pad of a semiconductor chip.

2. Description of the Related Art

A method of weakening the base portion of a gold wire connected to a bump after the bump is formed is disclosed in Japanese Patent Application Laid-Open No. 5-235002. In this related art, a capillary is horizontally moved after the formation of the bump, and the base portion of the gold wire connected to the bump is weakened. The weakening of the base portion of the gold wire has an advantage of being able to make cutting of the gold wire easy.

However, when the capillary is to be horizontally moved after formation of the bump, and if the moving speed is set to be equal to the moving speed of the capillary in the formation of the bump, then the shape and size of the weakened base portion of the gold wire become disadvantageously unstable due to high moving speed of the capillary. When the base portion still has excessively high strength, although the base portion is weakened, a projection extending upward is formed on the base portion in cutting process, and mechanical impact in the cutting process increases. At the moment the gold wire is cut, the gold wire fed from the capillary is bent and adversely affects a subsequent bonding operation. On the other hand, when the base portion is excessively weakened, the bump and the gold wire are disconnected from each other in the process of weakening. As a result, a gold wire cannot be fed from the capillary by a predetermined length for the next bonding operation.

SUMMARY OF THE INVENTION

The purpose of the present invention is to provide a method of manufacturing a semiconductor device in which the shape and size of the base portion of a gold wire can be stabilized while the base portion of the gold wire is weakened.

According to one aspect of the present invention, a method of manufacturing a semiconductor device includes a bump forming process for forming a bump on a pad. The bump forming process comprises a bump forming step, a sliding step and a cutting step. In the bump forming step, a gold wire is fed from a capillary while moving the capillary is moved to form a bump on the pad. In the sliding step, the capillary is moved slightly in substantially horizontal direction after the formation of the bump to reduce the strength of the base portion of the gold wire connected to the bump. In a cutting step, the gold wire is cut at the base portion after the sliding step. Further, a moving speed of the capillary in the sliding step is made smaller than that in the bump forming step.

Other and further objects, features and advantages of the invention will appear more fully from the following description.

In the method of manufacturing a semiconductor device according to the present invention, after the bump forming step of forming a bump, in the sliding step of slightly moving the capillary in the almost horizontal direction to reduce the strength of the base portion of the gold wire connected to the bump, the moving speed of the capillary is set to be smaller than that in the bump forming step. For this reason, in the sliding step, a moving distance of the gold wire in substantially horizontal direction is stabilized. Accordingly, the shape and size of the base portion of the gold wire connected to the bump are stabilized. An unnecessary projection can be prevented from being formed when the gold wire is cut at the base portion, and a hindrance to a subsequent bonding operation can be prevented.

DETAILED DESCRIPTION OF THE PREFERRED EMBODIMENTS

Preferred embodiments of the present invention will be described below with reference to the accompanying drawings.

First Embodiment

Figure 1:
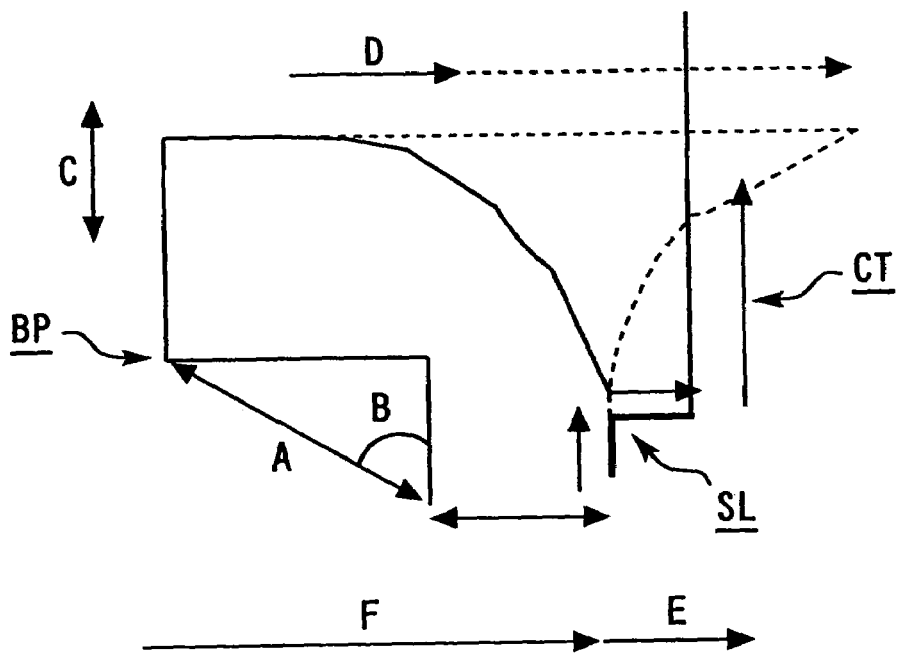
FIG. 1 is a graph showing movement of a capillary in a bump forming process included in the method of manufacturing a semiconductor device according to a first embodiment of the present invention.

FIG. 1 is a graph showing movement of a capillary in a bump forming process included in the method of manufacturing a semiconductor device according to the present invention. The bump forming process is executed by using a known boding machine. The bonding machine includes a capillary CP having a center hole through which a gold wire is fed, a damper CL, and a ball forming means BF for forming a ball BA at the tip end of the gold wire fed from the capillary CP.

The bump forming process shown in FIG. 1 includes three steps, i.e., a bump forming step BP, a sliding step SL, and a cutting step CT. The sliding step SL and the cutting step CT among the three steps are enlarged and shown in FIG. 2. In the first embodiment, a gold wire having a diameter d of 24.5 μm is used.

Figure 2:
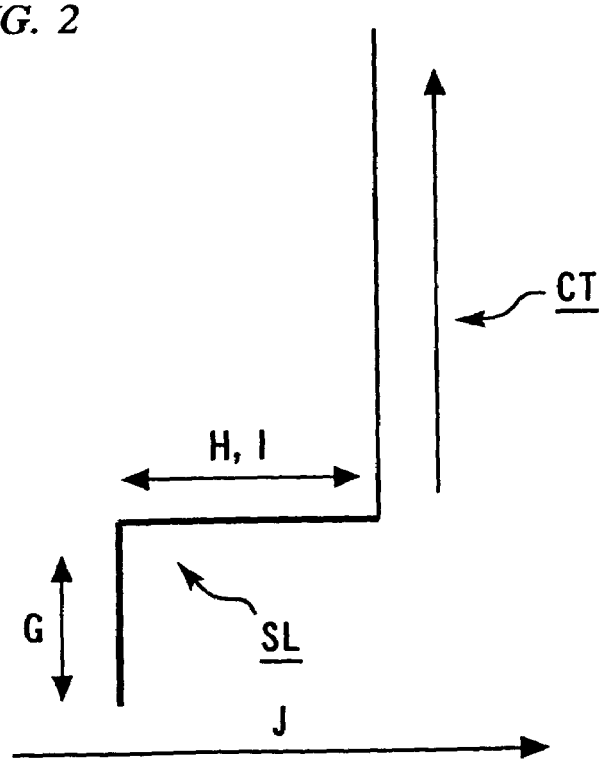
FIG. 2 is an enlarged graph showing the sliding step and the cutting step shown in GIG. 2.

FIGS. 1 and 2 show ten operations A to J of the capillary. The bump forming step BP includes the six operations A, B, C, D, E, and F, and the sliding step SL includes the four operations G, H, I, and J.

The bump forming step BP will be described below. The operation A in FIG. 1 is executed after a first bonding operation X1. In the first bonding operation X1, a gold wire is fed from the center hole of the capillary CP, the ball BA is formed at the tip end of the gold wire by using the ball forming means BF, and the ball BA is pressed on one pad of the semiconductor device. The ball forming means BF is, for example, means for generating arc discharge between the ball forming means BF and the tip end of the gold wire. The heat of the arc discharge forms the ball BA at the tip end of the gold wire. After the formation of the ball, the capillary CP is located above one pad of a semiconductor chip. In this state, the capillary is moved down to the pad, and the ball BA is pressed on the pad. This operation presses the ball BA on the pad to complete the first bonding operation X1.

In the operation A, the capillary CP is raised by a predetermined distance from the state, in which the ball BA is pressed on the pad by the capillary CP, in preparation for the next second bonding operation X2 and a gold wire is fed from the capillary CP. Besides the operation A, an operation B is the operation for giving a rising angle of the capillary CP. By the operations A and B, the capillary is moved obliquely upward for the second bonding operation by a distance depending on a rising of the operation A.

In an operation C, the capillary CP is moved by a predetermined amount of offset, for the second bonding operation X2, to a position shifted from the center of the ball BA bonded by the first bonding operation X1. In the operation C, the capillary CP is raised right upward. Subsequent to the operations A and B for moving the capillary CP obliquely upward, the capillary CP is raised right upward, so that the capillary CP is moved to a position distanced from the center of the ball BA by the predetermined amount of offset.

Subsequent to the operation C, an operation D circularly moves the capillary CP and finely controls an amount of the gold wire feed connected to the ball BA bonded on the pad by the first bonding operation X1. The amount of feed of the gold wire finely controlled by the operation D determines the height of a bump to be formed.

An operation E is to perform horizontal movement, performed after the feeding of the gold wire, for finely controlling the end position of the circular movement of the capillary CP by the operation D. With this operation, the amount of feed of the gold wire connected to the ball BA is finally controlled. An operation F sets the direction of the offset in relation to the amount of offset obtained by the operation C. The operation F sets a predetermined angular direction in 360° angular directions around the center of the ball BA bonded by the first bonding operation.

By the operations A to F, the gold wire is fed to the ball BA bonded on the pad by the first bonding operation X1. In the state where the gold wire is given a slack depending on an amount of feed, the second bonding operation X2 is executed on the ball BA. Thus, the first and second bonding operations X1 and X2 form a bump. The height of the bump is dependent on the height of the ball BA obtained by first bonding operation and the amount of feed of the gold wire by the operations A to F. The gold wire is connected to a position shifted from the center position of the formed bump by, the amount of offset generated by the operation C, and the gold wire extends almost right above to penetrate the center hole of the capillary CP.

The operations A to F of the capillary CP in the bump forming step BP are executed such that a moving speed V0 of the capillary CP is set at 500 (mm/sec) to 1000 (mm/sec). The moving speed V0 is considerably high. However, in order to efficiently perform a bonding process to a semiconductor chip, the moving speed V0 as such is generally employed.

Subsequent to the bump forming step BP, the sliding step SL is executed as a characteristic feature of the invention. The sliding step SL includes operations G, H, I, and J in FIG. 2.

The operation G is executed first in the sliding step SL, and is executed subsequent to the bump forming step BP. The operation G pulls up the capillary CP being in contact with the bump to a position where the capillary CP is not in contact with the bump, i.e., a position slightly distanced from the bump. In the operation G, more specifically, the capillary is raised right upward from the bump by a small diameter Gd of 110 μm or less. Since the diameter d of the gold wire is 24.5 μm, the pulling distance Gd is 449% of the diameter d of the gold wire. Actually, a pulling distance Gd is preferably set at 10 to 20 μm (39.3% to 78.7% of the diameter d of the gold wire). More specifically, a pulling distance Gd of 15 μm (59% of the diameter d of the gold wire) is set.

A moving speed Gv of the operation G is set to be ½ to ⅒ of the moving speed V0 in the bump forming step BP. More specifically, the moving speed Gv is set at ½ of the maximum value 1000 (mm/sec) of the moving speed V0, i.e., 500 (mm/sec), to ⅒ of the minimum value 500 (mm/sec) of the moving speed V0, i.e., 100 (mm/sec).

The operation H is a slide operation executed subsequent to the operation G. In the slide operation H, the capillary CP is moved by a slight distance in the horizontal direction, i.e., a direction almost parallel to the surface of the pad while applying supersonic waves. A moving distance Hd in the horizontal distance is 60% to 80% of the diameter D of the gold wire. That is, since the diameter d of the gold wire is 25.4 μm, the moving distance Hd is preferably set at 15.2 to 20.3 μm. More specifically, 70% of the diameter d of the gold wire, i.e., 17.8 μm is set. An operation I indicates supersonic waves applied to the capillary.

The moving speed Hv of the capillary CP in the slide operation H is set to be lower than the moving speed V0 in the bump forming step BP. The moving speed Hv is preferably ½ to ¹⁄₂₅ of the moving speed V0, and is preferably set at ½ of the maximum value of 1000 (mm/sec) of the moving speed V0, i.e., 250 (mm/sec), to ¹⁄₂₅ of the minimum value of 500 (mm/sec), i.e., 20 (mm/sec). In this range, the moving speed Hv is set at ¹⁄₁₅ of the moving speed V0, i.e., 66.7 (mm/sec) which is ¹⁄₁₅ of the maximum value of 1000 (mm/sec) of the moving speed V0 to ¹⁄₂₅ of the moving speed V0, i.e., 40 (mm/sec) which is ¹⁄₂₅ of the minimum value 500 (mm/sec) of the moving speed V0. In fact, the moving speed Hv is set at ¹⁄₂₅ of the maximum value of 1000 (mm/sec) of the moving speed V0, i.e., 40 (mm/sec).

An operation J sets a moving direction of the capillary in the operation H, i.e., a specific direction in 360° horizontal directions in which the capillary is moved.

In the sliding step SL, after the capillary CP is pulled up by the pulling distance Gd in the operation G, the capillary CP is horizontally moved in the slide operation H by the moving distance Hd at the moving speed Hv lower than the moving speed V0 of the capillary CP in the bump forming step BP. With the horizontal movement of the capillary CP, the capillary CP reduces the horizontal thickness of the base portion of the gold wire by horizontally pressing the base portion of the gold wire connected to the bump and extended right downward from the central hole of the capillary CP.

For example, in the first embodiment, a gold wire having a diameter of 25.4 μm is used, and the capillary CP is moved by the horizontal moving distance Hd which is 70% the diameter, i.e., 17.8 μm. In this case, the horizontal thickness of the base portion of the gold wire is simply reduced to 25.4−17.8=7.6 μm. The reduction in thickness of the base portion reduces the mechanical strength of the base portion of the gold wire.

In the slide operation H, supersonic vibration is applied to the capillary CP. The supersonic vibration reduces the friction between the capillary CP and the gold wire extending through the center hole of the capillary CP in the slide operation H to a proper value. With the supersonic vibration, the capillary CP horizontally smoothly presses the base portion of the gold wire without causing the gold wire to jam in the capillary CP, so that the thickness of the base portion is reduced.

Figure 3:
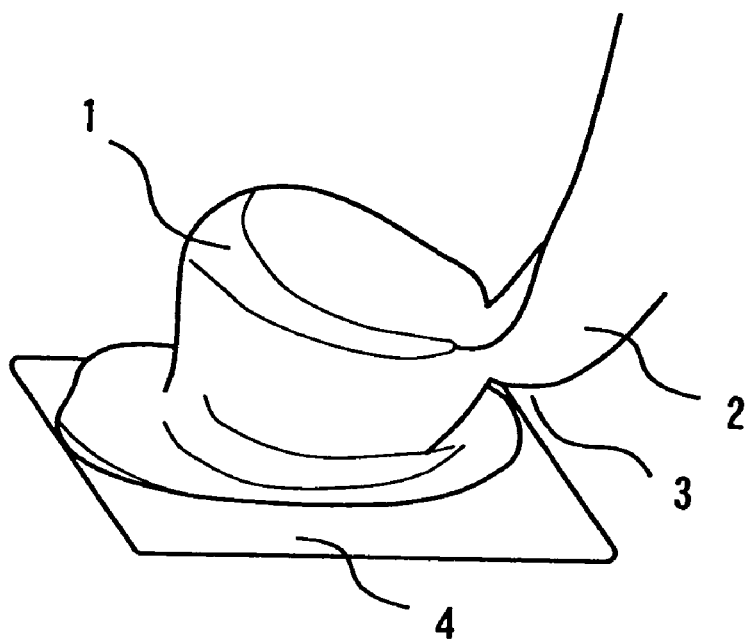
FIG. 3 is a perspective view showing a bump and a gold wire connected to the bump formed by a bump forming process in the first embodiment of the present invention.

FIG. 3 shows a bump and a gold wire connected to the bump on the final stage of the sliding step SL In FIG. 3, a bump 1 is formed on a pad 4. The gold wire 2 is connected to the bump 1 via its base portion 3. The upper surface of the bump 1 is made flat by the pressure produced by the capillary CP. A gold wire 2 is connected to the end portion on the upper surface of the flattened bump 1 through a base portion 3. The horizontal thickness of the base portion 3 is sufficiently smaller than the diameter of the gold wire 2 to reduce the mechanical strength of the base portion 3.

Since the horizontal moving speed Hv of the capillary CP in the sliding step SL is set to be smaller than the operation speed V0 of the capillary CP in the bump forming step BP, the moving distance of the capillary CP is always stable in the slide operation H. As a result, the thickness of the base portion 3 is stabilized, the reduction in strength becomes stable, and the base portion 3 is weakened to have almost uniform strength.

In contrast, when the moving speed Hv in the slide operation H is set to be equal to the operation speed V0, an acceleration generated by slight horizontal movement in the slide operation H is large. The large acceleration causes the following inconvenient cases. That is, the end position of horizontal movement is unstable not to reduce the horizontal thickness of the base portion 3 to a predetermined thickness, or the thickness of the base portion 3 becomes zero to cut the gold wire. When the base portion 3 is left thick, a projection extending upward is disadvantageously left when cutting the base portion 3 in the next cutting step CT. When the base portion 3 is cut by the slide operation H, the gold wire cannot be fed from the capillary CP and a tail portion cannot be secured before the next cutting step CT. A hindrance may occur to the subsequent bonding operation.

Subsequent to the sliding step SL the cutting step CT of the gold wire 2 is executed. Before the cutting step CT, an operation of pulling the capillary CP immediately upward by a predetermined distance, e.g., 500 to 600 μm, is performed. This operation secures a tail portion TP of the gold wire 2. This operation is executed when the gold wire 2 is connected to the bump 1 at the base portion 3. More specifically, the capillary CP is pulled upward when the gold wire 2 is connected to the bump 1, and the gold wire is fed from the capillary CP by a predetermined length. Thus, a tail portion having a predetermined length is secured. In the state in which the tail portion TP is secured, the gold wire 2 is clamped by a clamp means. In the state in which the gold wire 2 is clamped, and when the capillary CP is pulled upward, the gold wire is cut at the base portion 3. Resultantly, the tail portion TP extends from the capillary CP by a predetermined length. The clamp means does not operate until the cutting step CT is started, and the clamp means clamps the gold wire for the first time in the cutting step CT.

Figure 4:
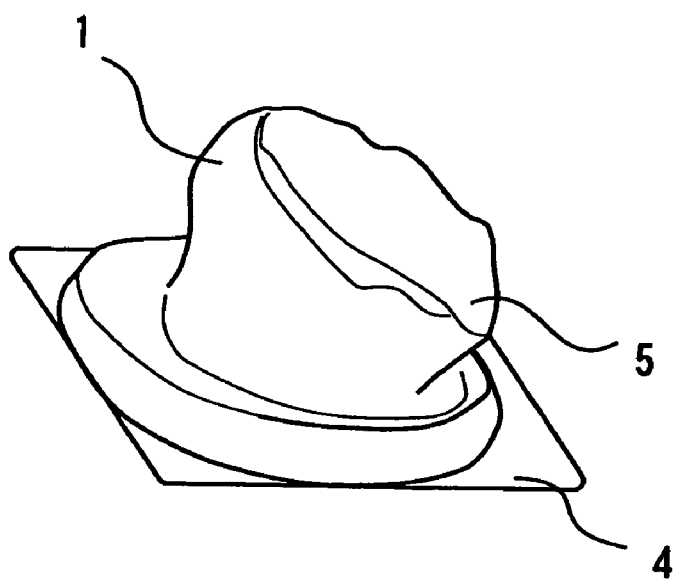
FIG. 4 is a perspective view showing a bump formed by the bump forming process in the first embodiment of the present invention.

FIG. 4 shows a bump obtained after the cutting step CT is completed. The gold wire is cut at the base portion 3, and a small extending portion 5 is formed. The small extending portion 5 horizontally slightly extends from the end portion of the upper surface of the bump 1, and will not hinder the subsequent bonding operation for the bump 1. The bump 1 itself shown in FIG. 4 can also be used for connection to other circuit. Alternatively as will be describe in the second embodiment, reverse bonding may be further performed, so that the bump 1 can be used for connection to an inner lead.

Figure 5:
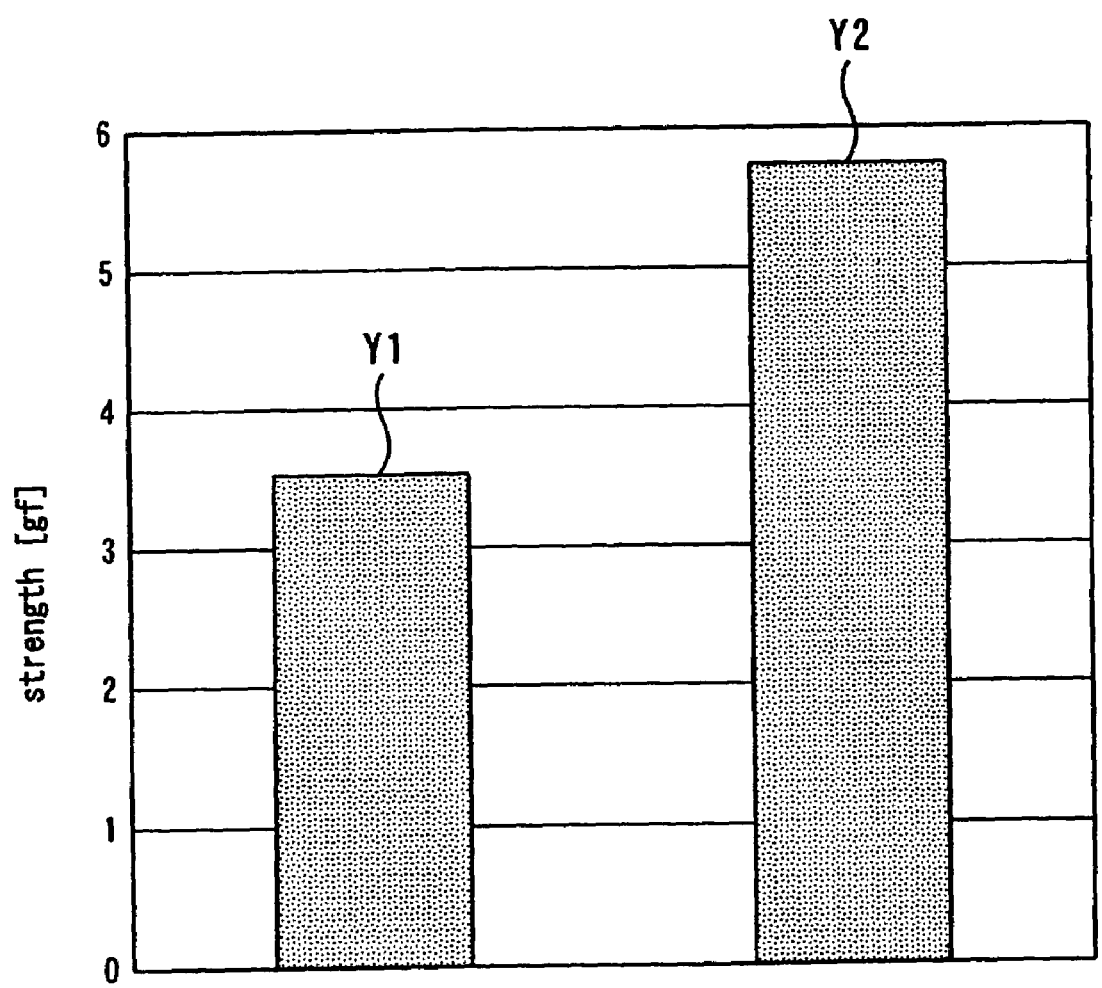
FIG. 5 is a graph showing cutting strength of the gold wire in comparison to the conventional technology.

FIG. 5 includes graphs showing cutting strengths of the gold wire in the cutting step CT. A graph Y1 indicates a cutting strength obtained in the first embodiment, and a graph Y2 indicates a cutting strength obtained when the sliding step SL is not performed to compare the cutting strengths with each other. The ordinate indicates a cutting strength [gram force (gf)]. The graphs Y1 and Y2 indicate cutting strengths obtained by using a gold wire having a diameter of 25.4 μm. However, in the first embodiment, since a horizontal moving distance Hd corresponding to 70% of the diameter is given, the cutting strength considerably decreases.

After the cutting step CT, a ball BA is formed again at the lower end of the tail portion TP of the gold wire fed from the capillary CP by a predetermined length. The ball BA is formed by a ball forming means and used in the next bonding. In the first embodiment, the horizontal thickness of the base portion 3 is secured in the sliding step SL. As a result, the tail portion TP having a predetermined length is secured, so that the ball BA can be formed without any hindrance.

The features and advantages of the first embodiment may be summarized as follows. As described above, in the first embodiment, after the bump 1 is formed by the bump forming step BP, the sliding step SL is performed in which the capillary CP is horizontally slightly moved to reduce the strength of the base portion 3 of the gold wire 2 connected to the bump 1, and the moving speed of the capillary CP in the sliding step SL is made lower than that in the bump forming step BP. For this reason, the substantially horizontal moving distance Hd in the sliding step SL can be stabilized. Accordingly, the horizontal thickness of the base portion 3 can be stabilized, and the strength of the base portion 3 can be set at a reduced value. Therefore, a stable bonding operation can be performed.

Since the moving speed Hv of the capillary CP in the sliding step SL is reduced to ½ to ½s of the operation speed V0 in the bump forming step BP, preferably, ⅟15 to ⅟25 of the operation speed V0, the substantially horizontal moving distance Hd in the sliding step SL can be sufficiently stabilized.

The substantially horizontal moving distance Hd of the capillary CP in the sliding step SL is set at 60 to 80%, particularly, 70%, of the diameter d of the gold wire. For this reason, the base portion 3 can obtain a required strength.

Since supersonic vibration is applied to the capillary CP in the sliding step SL, the capillary CP can be smoothly and stably moved by a predetermined moving distance Hd in an almost horizontal direction.

Further in the sliding step SL, before the capillary CP is almost horizontally moved, the capillary CP is raised in an almost vertical direction such that the capillary CP is distanced from the bump. For this reason, when the capillary CP is almost horizontally moved, the capillary CP can be smoothly and stably moved by the predetermined moving distance Hd without being caught by the bump 1.

Further, in the first embodiment, after the sliding step SL, in a state in which the gold wire 2 is connected to the bump 1, the capillary CP is raised, and the gold wire is fed from the capillary CP by a predetermined length. For this reason and owing to the stabilized base portion, the feeding of the gold wire from the capillary CP can be executed without any hindrance.

In addition, since the ball BA is formed on the end portion of the gold wire fed from the capillary CP, the ball BA having a predetermined size can be formed on the end portion of the gold wire having a predetermined length.

Second Embodiment

In the second embodiment, a bump 1 is formed by the method according to the first embodiment, and a gold wire 2 is cut at a base portion 3. Thereafter, the gold wire is fed by a predetermined length from the capillary CP, and a ball BA is formed on the end portion of the gold wire. In this state, ball bonding is performed to an inner lead of a semiconductor device by using the formed ball BA, and a reverse bonding step is executed in which the gold wire extending from the ball-banded lead is stitch-bonded on the bump.

In the ball banding, the ball BA formed on the tip end of the gold wire is bonded on the surface of an inner lead by the capillary CP. As is well known, the inner lead is arranged around a semiconductor chip. When the semiconductor chip is sealed by a resin package or the like, the inner lead is extended out of the resin package and electrically connected to an external circuit. From the ball bonding position, the gold wire is drawn on the upper surface of the bump 1 formed in a manner as described in the first embodiment, and is stitch-bonded on the upper surface of the bump 1. After the stitch bonding, the gold wire is cut at a position where the stitch bonding is performed. The gold wire extending from the ball-bonded lead to the position where the stitch bonding is performed electrically connects the inner lead to the bump on the semiconductor chip.

In the second embodiment, a predetermined relationship is kept between a direction from the inner lead to the bump and a direction of an operation F in a bump forming step BP, or a direction of an operation J in a sliding step SL. In the operation F, the direction of an offset is from the center of the ball BA bonded on a pad 4 by a first bonding operation X1, i.e., in 360° directions around the center of the ball bonded on the pad by the first bonding operation X1. This direction of offset is set to be almost equal to a direction from the inner lead to the bump. In the operation J, a moving direction is set in which the capillary CP is almost horizontally moved in the sliding step SL. As in the operation F, the direction is set to be almost equal to the direction from the inner lead to the bump.

In the second embodiment, the direction of the offset performed by the operation F and the direction of almost horizontal movement performed by the operation J are set to be almost equal to the direction from the inner lead to the bump. As a result, the base portion 3 is connected to the bump 1 at an end portion of the bump 1 on the opposite side of the inner lead. Furthermore, a slide operation G presses the base portion 3 in such a direction that the base portion 3 is distanced from the inner lead, and the extending portion 5 obtained by a cutting step CT is also left on the opposite side of the inner lead.

With this configuration, the gold wire extending from the inner lead to the bump is easily stitch-bonded on the upper surface of the bump 1, and the joining properties between the gold wire and the bump 1 are improved.

The method of manufacturing a semiconductor device according to the present invention is applied to manufacturing of a semiconductor integrated circuit or the like. The method is effectively used to form a bump having a stable shape and a stable size on a pad of a semiconductor integrated circuit.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2003-345470, filed on Oct. 3, 2003 including specification, claims, drawings and summary, on which the Convention priority of the present application is based, are incorporated herein by reference in its entirety.

What is claimed is:

1. A method of manufacturing a semiconductor device including a bump forming process for forming a bump on a pad, said bump forming process comprising:

a bump forming step for feeding a gold wire from a capillary while moving said capillary to form a bump on said pad;

a sliding step of slightly moving said capillary in substantially horizontal direction after the formation of said bump to reduce the strength of a said base portion of said gold wire connected to said bump; and a cutting step of cutting said gold wire at said base portion after said sliding step;

wherein a moving speed of said capillary in said sliding step is made smaller than that in said bump forming step;

wherein said capillary is raised with said gold wire being fed from said capillary by a predetermined length and wire cutting is executed in said cutting step; and wherein, after said cutting step, a ball is formed on an end portion of said gold wire fed from said capillary;

the method further including, after forming said ball, a step of bonding the ball on a ball bonding point outside the semiconductor chip and then stitch-bonding the gold wire extending from said ball onto said bump.

2. The method of manufacturing a semiconductor device according to claim 1, wherein, in said sliding step, said capillary is slightly moved in a direction from said ball bonding point to said bump.

3. The method of manufacturing a semiconductor device according to claim 1, wherein supersonic vibration is applied to said capillary in said sliding step when said capillary is substantially horizontally moved.

4. The method of manufacturing a semiconductor device according to claim 1, wherein said capillary is substantially vertically raised slightly to be distanced from said bump before said capillary is substantially horizontally moved in said sliding step.

5. The method of manufacturing a semiconductor device according to claim 1, wherein the bump forming process includes the steps of:

forming another ball at an end of the wire;

pressing the other ball onto the pad with the capillary;

moving the capillary to a first point obliquely above the pad with the wire being fed from the capillary, a horizontal direction from the pad to the first point being a first direction;

raising the capillary upward from the first point to a second point; and moving the capillary obliquely downward from the second point to a third point, a horizontal direction from the second point to the third point being a second direction opposite to the first direction.

6. The method of manufacturing a semiconductor device according to claim 5, wherein said capillary is substantially vertically raised to be distanced from said bump before said capillary is substantially horizontally moved in said sliding step.

* * * * *